(12) United States Patent
Yamada

(10) Patent No.: US 10,269,774 B2
(45) Date of Patent: Apr. 23, 2019

(54) SEMICONDUCTOR DEVICE

(71) Applicant: SOCIONEXT INC., Kanagawa (JP)

(72) Inventor: Takashi Yamada, Inagawa (JP)

(73) Assignee: Socionext Inc., Yokohama-shi, Kanagawa (JP)

( * ) Notice: Subject to any disclaimer, the term of this patent is extended or adjusted under 35 U.S.C. 154(b) by 0 days.

(21) Appl. No.: 15/838,180

(22) Filed: Dec. 11, 2017

(65) Prior Publication Data

US 2018/0102346 A1    Apr. 12, 2018

Related U.S. Application Data

(63) Continuation of application No. PCT/JP2016/002851, filed on Jun. 13, 2016.

(30) Foreign Application Priority Data

Jun. 12, 2015  (JP) .................................. 2015-119379

(51) Int. Cl.
*H01L 25/065* (2006.01)
*H01L 23/12* (2006.01)
(Continued)

(52) U.S. Cl.
CPC .......... *H01L 25/0657* (2013.01); *H01L 23/12* (2013.01); *H01L 23/5384* (2013.01);
(Continued)

(58) Field of Classification Search
CPC . H01L 25/0657; H01L 23/5389; H01L 24/19; H01L 24/20; H01L 24/73
See application file for complete search history.

(56) References Cited

U.S. PATENT DOCUMENTS

2001/0038151 A1* 11/2001 Takahashi ........... H01L 23/3107
257/778
2004/0219717 A1   11/2004 Takahashi et al.
(Continued)

FOREIGN PATENT DOCUMENTS

JP   H06-326211 A   11/1994
JP   2001-257310 A   9/2001
(Continued)

OTHER PUBLICATIONS

Search Report issued in corresponding International Patent Application No. PCT/JP2016/002851, dated Jul. 12, 2016.
(Continued)

*Primary Examiner* — Walter H Swanson
(74) *Attorney, Agent, or Firm* — McDermott Will & Emery LLP

(57) ABSTRACT

In a semiconductor device, a first semiconductor chip having a main surface provided with a first terminal group including terminals, and a rear face mounted on a surface of a support. A second semiconductor chip has a main surface provided with a second terminal group including terminals, the main surface of the second semiconductor chip facing the main surface of the first semiconductor chip, and each of the terminals in the second terminal group being connected to a corresponding one of the terminals in the first terminal group of the first semiconductor chip. The first semiconductor chip is connected to an external terminal of the semiconductor device via a conductor containing a single metal.

10 Claims, 20 Drawing Sheets

(51) Int. Cl.
  *H01L 25/18* (2006.01)
  *H01L 23/00* (2006.01)
  *H01L 23/538* (2006.01)
  *H01L 25/10* (2006.01)
  *H01L 25/00* (2006.01)

(52) U.S. Cl.
  CPC ...... *H01L 23/5386* (2013.01); *H01L 23/5389* (2013.01); *H01L 24/19* (2013.01); *H01L 24/20* (2013.01); *H01L 24/73* (2013.01); *H01L 24/92* (2013.01); *H01L 25/105* (2013.01); *H01L 25/18* (2013.01); *H01L 25/50* (2013.01); *H01L 24/16* (2013.01); *H01L 24/32* (2013.01); *H01L 2224/0401* (2013.01); *H01L 2224/04105* (2013.01); *H01L 2224/12105* (2013.01); *H01L 2224/16145* (2013.01); *H01L 2224/16227* (2013.01); *H01L 2224/214* (2013.01); *H01L 2224/32145* (2013.01); *H01L 2224/32225* (2013.01); *H01L 2224/32245* (2013.01); *H01L 2224/73204* (2013.01); *H01L 2224/73209* (2013.01); *H01L 2224/73253* (2013.01); *H01L 2224/73267* (2013.01); *H01L 2224/92* (2013.01); *H01L 2224/92133* (2013.01); *H01L 2224/92244* (2013.01); *H01L 2225/06513* (2013.01); *H01L 2225/06527* (2013.01); *H01L 2225/06548* (2013.01); *H01L 2225/06558* (2013.01); *H01L 2225/06586* (2013.01); *H01L 2225/1035* (2013.01); *H01L 2225/1041* (2013.01); *H01L 2225/1058* (2013.01); *H01L 2924/1431* (2013.01); *H01L 2924/1434* (2013.01); *H01L 2924/15151* (2013.01); *H01L 2924/15153* (2013.01); *H01L 2924/15311* (2013.01)

(56) References Cited

U.S. PATENT DOCUMENTS

| 2005/0121802 | A1* | 6/2005 | Kawano | H01L 24/73 257/777 |
|---|---|---|---|---|
| 2008/0237883 | A1 | 10/2008 | Tago et al. | |
| 2012/0205789 | A1 | 8/2012 | Natsuaki et al. | |
| 2014/0103504 | A1 | 4/2014 | Yamashita et al. | |
| 2014/0124941 | A1 | 5/2014 | Sakamoto | |
| 2016/0013124 | A1* | 1/2016 | Chen | H01L 21/78 257/774 |

FOREIGN PATENT DOCUMENTS

| JP | 2008-251912 A | 10/2008 |
|---|---|---|
| JP | 2012-169440 A | 9/2012 |
| JP | 2013-030568 A | 2/2013 |
| JP | 2014-090148 A | 5/2014 |
| WO | 2010/047227 A1 | 4/2010 |
| WO | 2011/021364 A1 | 2/2011 |
| WO | 2013/057867 A1 | 4/2013 |
| WO | 2013/105153 A1 | 7/2013 |

OTHER PUBLICATIONS

Written Opinion issued in corresponding International Patent Application No. PCT/JP2016/002851, dated Jul. 12, 2016.

* cited by examiner

SEMICONDUCTOR DEVICE

CROSS-REFERENCE TO RELATED APPLICATIONS

This is a continuation of International Application No. PCT/JP2016/002851 filed on Jun. 13, 2016, which claims priority to Japanese Patent Application No. 2015-119379 filed on Jun. 12, 2015. The entire disclosures of these applications are incorporated by reference herein.

BACKGROUND

The present disclosure relates to a semiconductor device on which a stack of semiconductor chips is mounted.

To achieve high density in a small size, a semiconductor chip package has a structure in which multiple semiconductor chips are stacked and mounted. Known examples of such a structure for stacking semiconductor chips include a chip-on-chip (COC) connection structure in which terminals provided to circuit surfaces of semiconductor chips are connected to each other.

Japanese Unexamined Patent Publication No. 2013-30568 discloses a COC structure in which a chip expansion portion is provided to surround a periphery of a lower semiconductor chip. In this structure, a wire is provided on the chip expansion portion and connected to a terminal of the lower semiconductor chip. This wire and an external electrode of a package substrate are connected together via a bonding wire.

Japanese Unexamined Patent Publication No. 2012-169440 discloses a COC structure in which a first semiconductor chip is embedded in a resin layer so that a terminal of the first semiconductor chip appears on a surface of the resin layer, and a second semiconductor chip is provided on the first semiconductor chip. In this structure, a wiring layer is provided on a surface of the resin layer and connected to an external terminal of a semiconductor device. Terminals such as a bump included in the second semiconductor chip are connected to this wiring layer.

SUMMARY

In the configuration disclosed in Japanese Unexamined Patent Publication No. 2013-30568, the terminal of the semiconductor chip and the external electrode of the package substrate are connected via the bonding wire. Such a configuration requires a space and a region for wire bonding, making it difficult to further downsize a semiconductor package. Moreover, the bonding wire is high in impedance and large in LC component, and is not thus suitable for transmitting a signal at a ultra high speed of, for example, 10 Gbps. Furthermore, in terms of power supply, the bonding wire is likely to cause a voltage drop of a power source within the semiconductor chip. In addition, the bonding wire makes production process complex.

In the configuration disclosed in Japanese Unexamined Patent Publication No. 2012-169440, the problems found in the configuration disclosed in Japanese Unexamined Patent Publication No. 2013-30568 are seemingly solved because no wire bonding is used. However, an electrical path from the second semiconductor chip to the external terminal of the semiconductor device includes: the terminals such as the bump included in the second semiconductor chip; and the wiring layer provided on the surface of the resin layer in which the first semiconductor chip is embedded. Such a configuration causes the following problems: an impedance in a joint between the terminal and the wiring layer degrades characteristics of a frequency band, and a voltage drop is likely to occur because a current tolerance of a terminal such as a bump is low.

The present disclosure is directed to a semiconductor device in a COC structure, and attempts to make the structure high in density, small in size, and suitable for high speed operation.

In an aspect of the present disclosure, a semiconductor device includes: a support; a first semiconductor chip having a main surface provided with a first terminal group including terminals, and a rear face mounted on a surface of the support; a second semiconductor chip having a main surface provided with a second terminal group including terminals, the main surface of the second semiconductor chip facing the main surface of the first semiconductor chip, and each of the terminals in the second terminal group being connected to a corresponding one of the terminals in the first terminal group of the first semiconductor chip; and an external terminal, wherein the first semiconductor chip is connected to the external terminal via a conductor containing a single metal.

According to this aspect, the first semiconductor chip is connected to the external terminal of the semiconductor device via a conductor containing a single metal. Such a configuration reduces impedance in an electrical path from the first semiconductor chip to the external terminal of the semiconductor device, and an LC component. The low impedance and LC component reduce signal attenuation in this electrical path and power source voltage drop, making it possible for the semiconductor device to operate at a high speed.

The present disclosure is directed to a semiconductor device in a COC structure, and successfully implements a structure which is high in density, small in size, and suitable for high speed operation.

DETAILED DESCRIPTION

Semiconductor devices according to embodiments are described below with reference to the drawings. The semiconductor devices described here have a COC connection structure in which terminals, such as microbumps, provided to the main surface (a circuit surface) of a semiconductor chip are connected to each other.

First Embodiment

Figure 1:
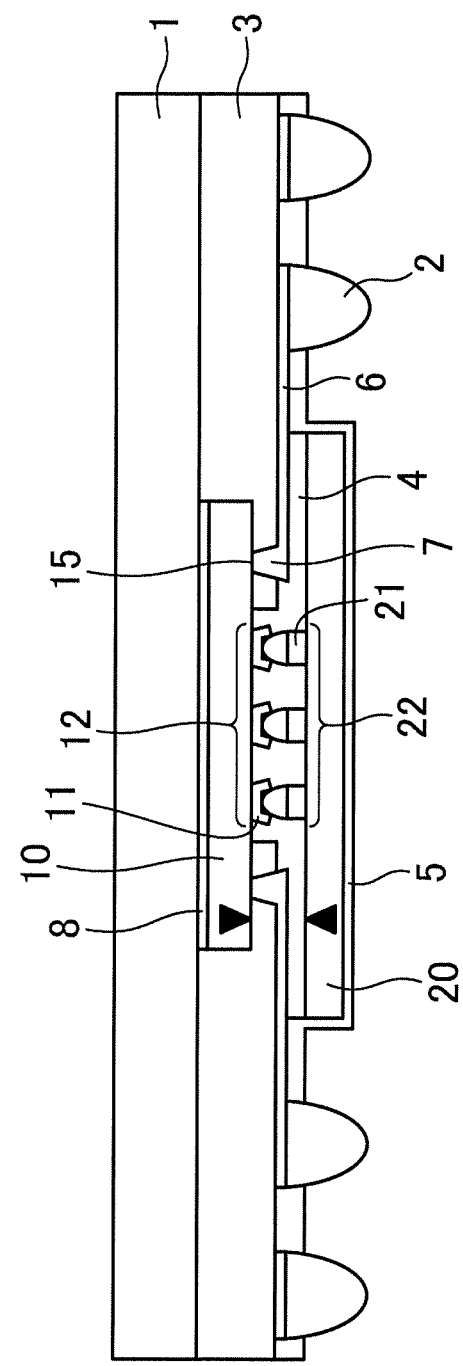
FIG. 1 is a cross-sectional view illustrating an example of a configuration of a semiconductor device according to a first embodiment.

FIG. 1 is a cross-sectional view illustrating an example of a configuration of a semiconductor device according to a first embodiment. Note that the cross-sectional view in FIG. 1 and the subsequent cross-sectional views schematically illustrate cross sections of the main parts of the semiconductor devices.

In FIG. 1, a first semiconductor chip 10 is mounted on a surface of a support 1. The support 1 may be made of metal, and may also be a substrate made of, for example, an organic material or glass epoxy. The first semiconductor chip 10 is, for example, a system-on-chip (SoC), and includes integrated circuits such as a logic circuit and a memory. The first semiconductor chip 10 is bonded to the support 1 with an adhesive 8, with a circuit surface (equivalent to a main surface) of the first semiconductor chip 10 facing upward (facing toward the opposite side of the support 1). Note that, in FIG. 1, the bottom of the drawing is the top of the semiconductor device, and the top of the drawing is the bottom of the semiconductor device. The subsequent cross-sectional views of the configurations are illustrated in a similar manner unless otherwise noted. Moreover, a black triangle illustrated in a semiconductor chip shows which face the main surface of the semiconductor chip is. A face pointed with a vertex of the black triangle is the main surface of the semiconductor chip. The first semiconductor chip 10 has, on the circuit surface, terminals 11 such as microbump electrodes or pillar electrodes containing Cu. A region having the terminals 11 is referred to as a first terminal group 12.

A second semiconductor chip 20 is mounted so that a circuit surface (equivalent to a main surface) of the second semiconductor chip 20 faces the main surface of the first semiconductor chip 10. The second semiconductor chip 20 is, for example, a memory chip, and includes integrated circuits such as a logic circuit and a memory. Furthermore, the second semiconductor chip 20 has, on the circuit surface, terminals 21 such as, for example, pillar electrodes containing Cu. A region having the terminals 21 is referred to as a second terminal group 12. Each of the terminals 21 in the second terminal group 22 of the second semiconductor chip 20 is connected to a corresponding one of the terminals 11 in the first terminal group 12 of the first semiconductor chip 10. Here, the second semiconductor chip 20 is larger in surface area than the first semiconductor chip 10.

A chip expansion portion 3 is provided to surround a periphery of the first semiconductor chip 10. The chip expansion portion 3 is formed of, for example, resin. In addition to the periphery of the first semiconductor chip 10, the chip expansion portion 3 covers regions other than the first terminal group 12 provided on the circuit surface of the first semiconductor chip 10. The chip expansion portion 3 has: a wire 6 formed on a surface of the chip expansion portion 3 toward the second semiconductor chip 20; and a via 7 formed to be connected to this wire 6. The via 7 is formed on a portion, of the chip expansion portion 3, covering the circuit surface of the first semiconductor chip 10. The via 7 is connected to a terminal 15 provided within the first semiconductor chip 10. The wire 6 and the via 7 connected to each other are integrally formed as a conductor containing a single metal such as Cu. The surface of the chip expansion portion 3 has an external terminal 2, such as a soldering ball, connected to the wire 6. A solder resist 5 is formed to cover: a region, of the surface of the chip expansion portion 3, not having the external terminal 2; and a rear face and a side face of the second semiconductor chip 20. Note that this solder resist 5 may be omitted.

Moreover, a filler layer 4 containing resin is sandwiched between the first semiconductor chip 10 and the second semiconductor chip 20. Specifically, a layer of resin alone covers a portion connecting the terminals 11 of the first semiconductor chip 10 and the terminals 21 of the second semiconductor chip 20 together.

Figure 2:
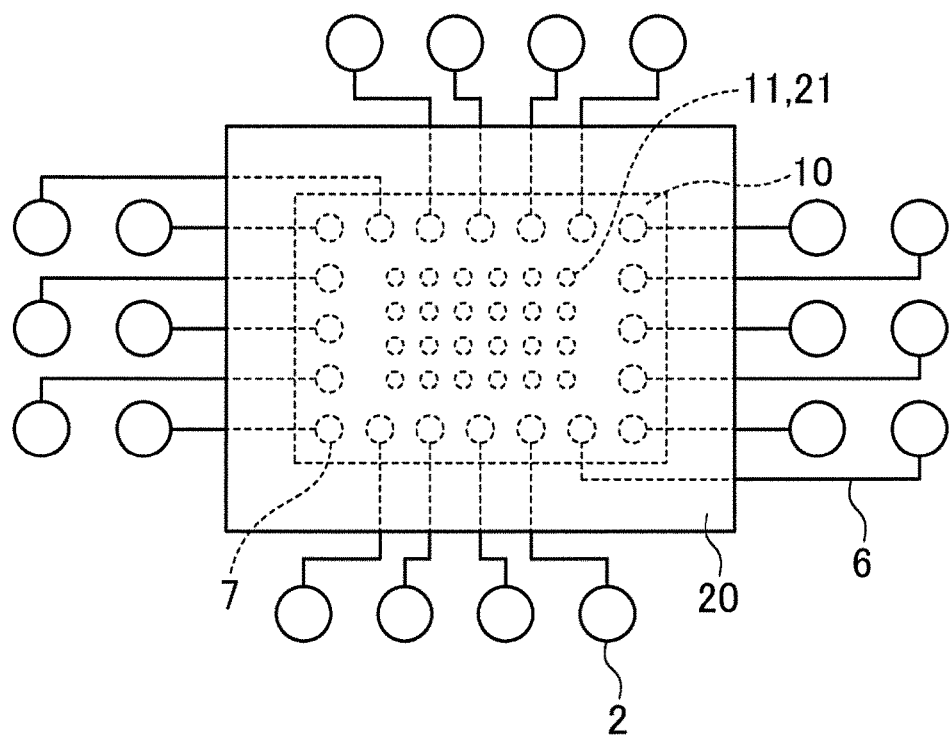
FIG. 2 is a plan view illustrating an example of a configuration of the semiconductor device according to the first embodiment.

FIG. 2 is a plan view illustrating an example of a configuration of the semiconductor device according to this embodiment. The plan view illustrates the configuration in FIG. 1 observed from the bottom of the drawing (i.e., from the top of the semiconductor device). FIG. 2 schematically illustrates a plan view of the main part of the semiconductor device. As illustrated in FIG. 2, the second semiconductor chip 20 is mounted above the first semiconductor chip 10. The external output terminal 2 is connected to the first semiconductor chip 10 through the wire 6 and the via 7. Each of the terminals 11 of the first semiconductor chip 10 is connected to a corresponding one of the terminals 21 of the second semiconductor chip 20.

Figure 3A:
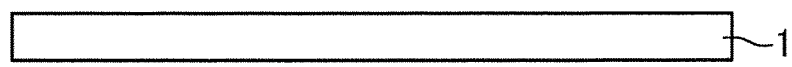
FIG. 3A is a cross-sectional view of a step, the view illustrating an example of a method for manufacturing the semiconductor device according to the first embodiment.
Figure 3B:
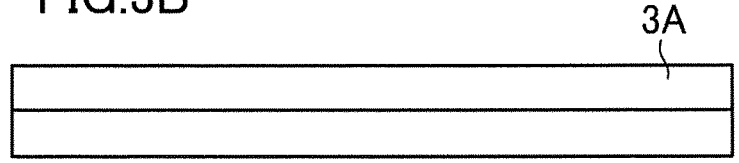
FIG. 3B is a cross-sectional view of a step, the view illustrating an example of the method for manufacturing the semiconductor device according to the first embodiment.
Figure 3C:
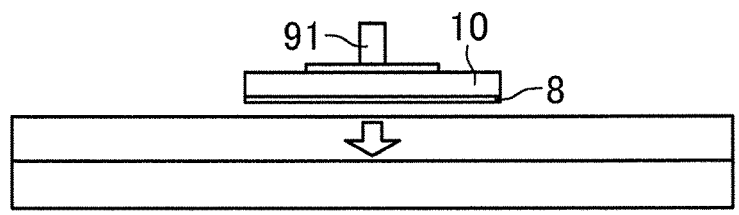
FIG. 3C is a cross-sectional view of a step, the view illustrating an example of the method for manufacturing the semiconductor device according to the first embodiment.
Figure 3D:
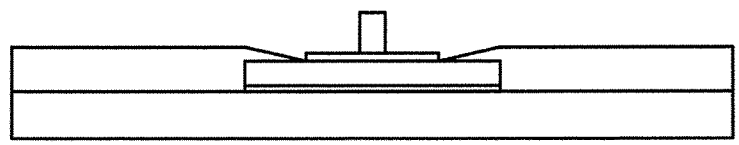
FIG. 3D is a cross-sectional view of a step, the view illustrating an example of the method for manufacturing the semiconductor device according to the first embodiment.
Figure 3E:
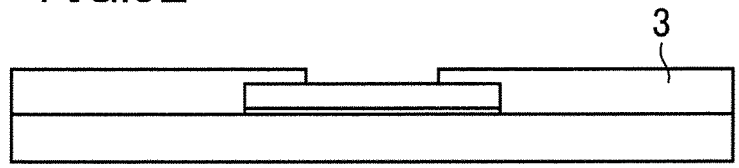
FIG. 3E is a cross-sectional view of a step, the view illustrating an example of the method for manufacturing the semiconductor device according to the first embodiment.
Figure 3F:
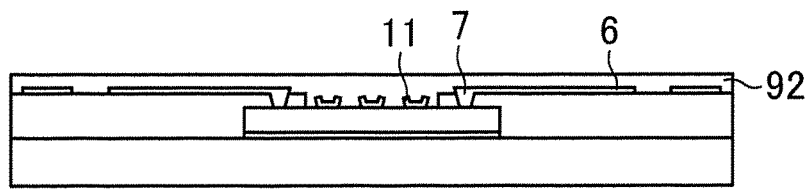
FIG. 3F is a cross-sectional view of a step, the view illustrating an example of the method for manufacturing the semiconductor device according to the first embodiment.

FIGS. 3A to 3F and FIGS. 4A to 4D are cross-sectional views of steps. The views illustrate an example of a method for manufacturing the semiconductor device according to this embodiment. First, the support 1 is prepared (FIG. 3A). A thin film is formed of fluid resin 3A. When cured, the resin 3A becomes the chip expansion portion 3 (FIG. 3B). Then, the first semiconductor chip 10 is mounted on the support 1 with a mounter 91 (FIG. 3C). The first semiconductor chip 10 is bonded to the support 1 with the adhesive 8. Then, the resin is poured (FIG. 3D). The resin is cured while the surface of the resin is planarized. As a result, the chip expansion portion 3 is formed (FIG. 3E). Within the chip expansion portion 3, the via 7 is formed. The via 7 is connected to a terminal provided within the first semiconductor chip 10. On the surface of the chip expansion portion 3, the wire 6 is formed. The via 7 and the wire 6 are integrally formed of a single metal such as a coating of Cu. Moreover, for protection of the via 7 and the wire 6 to be formed into individual pieces, a passivation film 92 is formed to cover the chip expansion portion 3 (FIG. 3F).

Figure 4A:
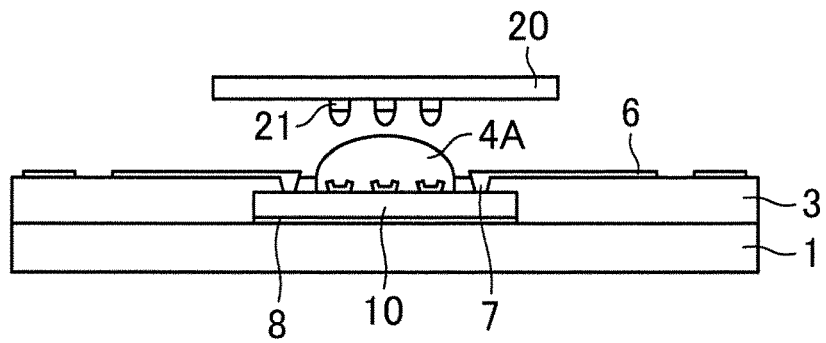
FIG. 4A is a cross-sectional view of a step, the view illustrating an example of the method for manufacturing the semiconductor device according to the first embodiment.
Figure 4B:
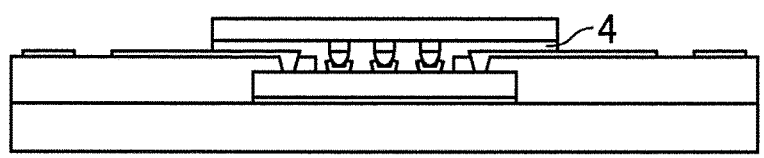
FIG. 4B is a cross-sectional view of a step, the view illustrating an example of the method for manufacturing the semiconductor device according to the first embodiment.
Figure 4C:
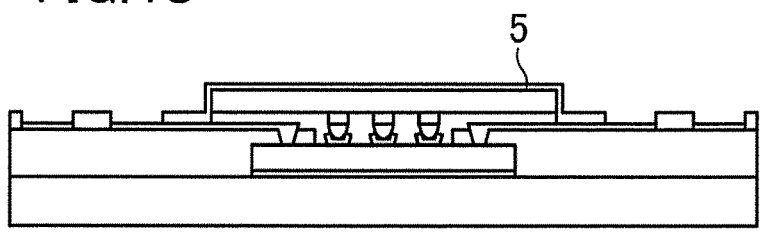
FIG. 4C is a cross-sectional view of a step, the view illustrating an example of the method for manufacturing the semiconductor device according to the first embodiment.

When the via 7 and the wire 6 become individual pieces, the passivation film 92 is removed. Then, a filler 4A is applied on the circuit surface of the first semiconductor chip 10, and the second semiconductor chip 20 is mounted above the first semiconductor chip 10 (FIG. 4A). The filler 4A is thermocompression-bonded to form the filler layer 4, and the second semiconductor chip 20 is fixed with the filler layer 4 (FIG. 4B). Then, the solder resist 5 is formed on the surface of the chip expansion portion 3, and on the rear face and the side face of the second semiconductor chip 20 (FIG.

Figure 4D:
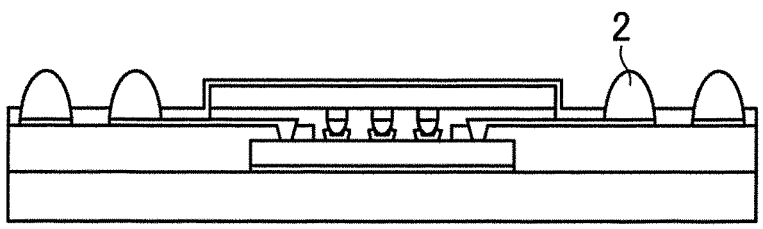
FIG. 4D is a cross-sectional view of a step, the view illustrating an example of the method for manufacturing the semiconductor device according to the first embodiment.

4C). The external terminal 2 such as a soldering ball connected to the wire 6 is formed (FIG. 4D).

According to the configuration in this embodiment, the external terminal 2 of the semiconductor device and the first semiconductor chip 10 are connected to each other through the via 7 and the wire 6. The via 7 and the wire 6 are integrally formed of a single metal such as a coating of Cu. This configuration reduces impedance in an electrical path from the first semiconductor chip 10 to the external terminal 2 of the semiconductor device, and an LC component. The low impedance and LC component reduce signal attenuation in this electrical path and power source voltage drop, making it possible for the semiconductor device to operate at a high speed.

Moreover, in the configuration of this embodiment, a connection portion between the first semiconductor chip 10 and the second semiconductor chip 20 is covered with a layer of resin. Meanwhile, in the configuration disclosed in Japanese Unexamined Patent Publication No. 2012-169440 cited above, the first semiconductor chip embedded in a resin layer is connected to the second semiconductor chip. The gap between the first semiconductor chip and the second semiconductor chip is filled with another kind of resin. Thus, a connection portion between the first semiconductor chip and the second semiconductor chip is covered with two layers of resin. Such a configuration poses problems: the different kinds of resin have the different expansion coefficients, which tends to cause a faulty join and open, for example, a crack by bending stress. In contrast, this embodiment does not have such problems, and excels Japanese Unexamined Patent Publication No. 2012-169440 in reliability.

Moreover, as can be seen from the cross-sectional views of the steps, this embodiment eliminates the need for wire bonding and turning the semiconductor device upside down during the steps. Thus, the semiconductor device according to this embodiment can be implemented in a simple manufacturing process.

Second Embodiment

Figure 5:
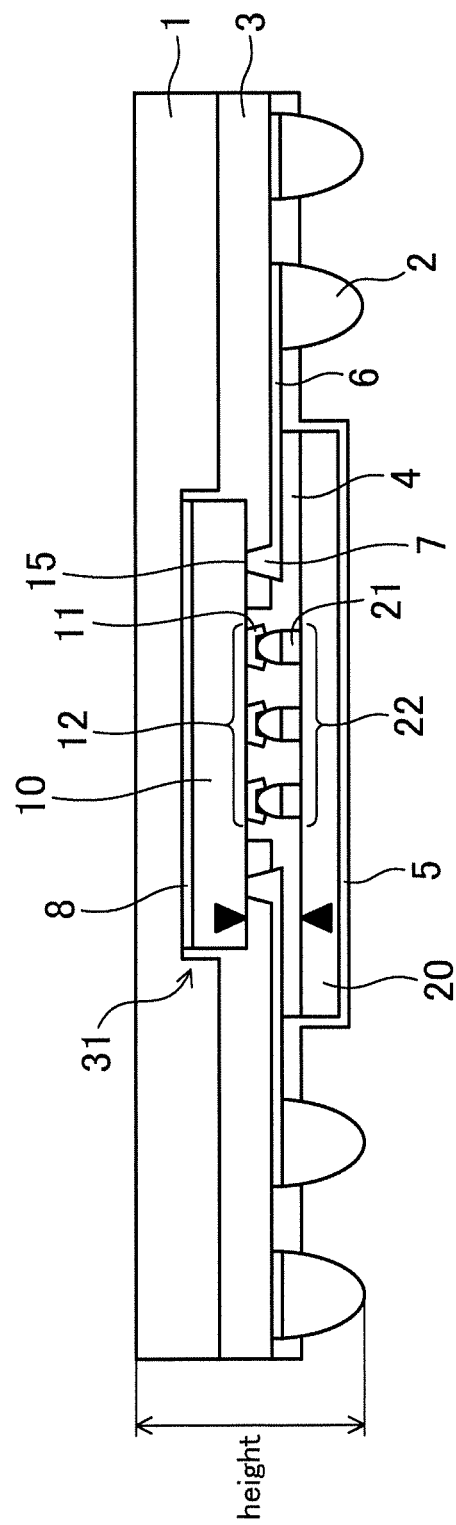
FIG. 5 is a cross-sectional view illustrating an example of a configuration of a semiconductor device according to a second embodiment.

FIG. 5 is a cross-sectional view illustrating an example of a configuration of a semiconductor device according to a second embodiment. The basic configuration illustrated in FIG. 5 is almost the same as that in FIG. 1. In FIG. 5, constituent elements in common with those in FIG. 1 are denoted with the same reference numerals, and detailed descriptions thereof may be omitted.

In the configuration illustrated in FIG. 5, the support 1 has a recess 31 on the main surface; that is, a face on which the first semiconductor chip 10 is mounted. The first semiconductor chip 10 is placed in the recess 31. Compared with the configuration illustrated in FIG. 1, the chip expansion portion 3 in FIG. 5 is thin, and the height of the semiconductor device is reduced. Conversely, when the semiconductor device in the second embodiment is implemented to have the same height as that in the first embodiment, the first semiconductor chip 10 in the second embodiment can be kept thicker than that in the first embodiment.

According to the configuration of this embodiment, the first semiconductor chip 10 is mounted to fit into the recess 31 of the support 1. Such a feature requires less amount of resin to form the chip expansion portion 3. Furthermore, the first semiconductor chip 10 does not have to be thin, making it possible to omit a polishing process and a fabrication facility of wafer slices and to reduce production costs. Moreover, the first semiconductor chip 10 is kept thick so that thermal conductivity of the first semiconductor chip 10 can be maintained high. Such a feature makes it possible to increase conductivity of heat from a top face of the semiconductor device.

Third Embodiment

Figure 6:
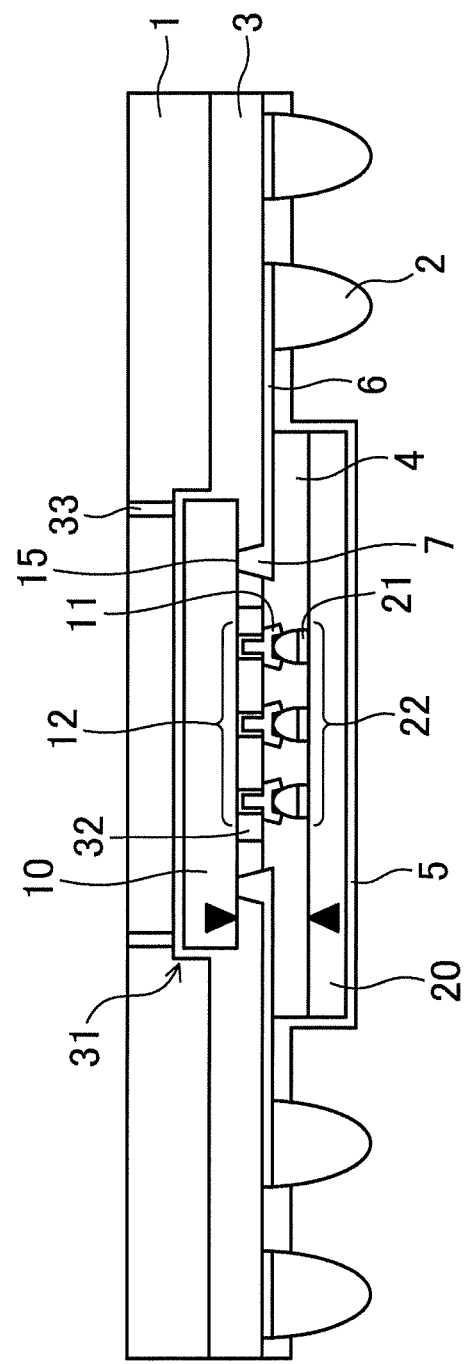
FIG. 6 is a cross-sectional view illustrating an example of a configuration of a semiconductor device according to a third embodiment.

FIG. 6 is a cross-sectional view illustrating an example of a configuration of a semiconductor device according to a third embodiment. The basic configuration illustrated in FIG. 6 is almost the same as that in FIG. 1. In FIG. 6, constituent elements in common with those in FIG. 1 are denoted with the same reference numerals, and detailed descriptions thereof may be omitted.

In the configuration illustrated in FIG. 6, the first semiconductor chip 10 has, on the circuit surface, a protrusion 32 containing, for example, an insulating material such as resin and polyimide. Each of the terminals 11 in the first terminal group 12 of the first semiconductor chip 10 is provided on a top surface of the protrusion 32. Moreover, similar to the second embodiment, the support 1 has the recess 31 on a surface, of the support 1, on which the first semiconductor chip 10 is mounted. The first semiconductor chip 10 is mounted to fit into the recess 31. Note that in the configuration illustrated in FIG. 1 and having no recess 31 on the support 1, the protrusion 32 may be provided to the circuit surface of the first semiconductor chip 10.

Furthermore, the support 1 has a hole 33 penetrating from a rear face of the support 1 to an interior face of the recess 31. Here, the rear face is opposite a face on which the first semiconductor chip 10 is mounted. In the manufacturing process, the hole 33 is used to suck resin forming the chip expansion portion 3. Note that the hole 33 may be omitted. Moreover, the hole 33 may be formed in the configuration illustrated in FIG. 5.

Figure 7A:
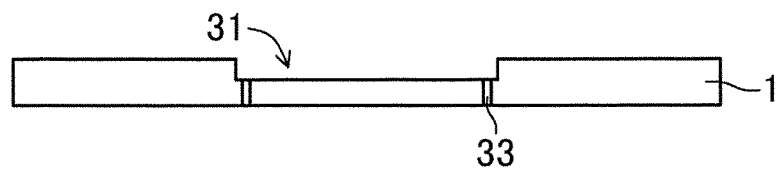
FIG. 7A is a cross-sectional view of a step, the view illustrating an example of a method for manufacturing the semiconductor device according to the third embodiment.
Figure 7B:
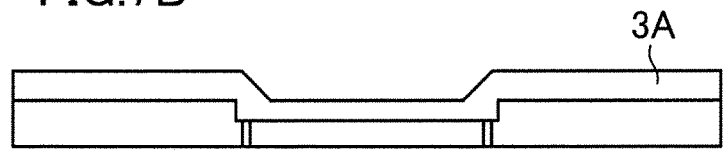
FIG. 7B is a cross-sectional view of a step, the view illustrating an example of the method for manufacturing the semiconductor device according to the third embodiment.
Figure 7C:
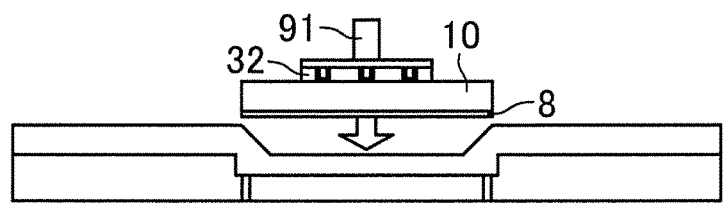
FIG. 7C is a cross-sectional view of a step, the view illustrating an example of the method for manufacturing the semiconductor device according to the third embodiment.
Figure 7D:
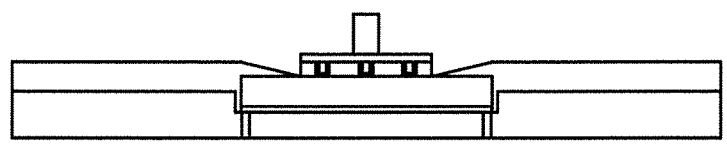
FIG. 7D is a cross-sectional view of a step, the view illustrating an example of the method for manufacturing the semiconductor device according to the third embodiment.
Figure 7E:
FIG. 7E is a cross-sectional view of a step, the view illustrating an example of the method for manufacturing the semiconductor device according to the third embodiment.
Figure 7F:
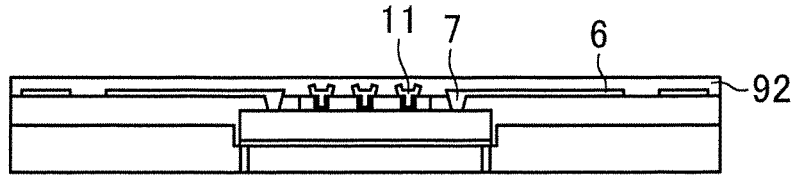
FIG. 7F is a cross-sectional view of a step, the view illustrating an example of the method for manufacturing the semiconductor device according to the third embodiment.

FIGS. 7A to 7F and FIGS. 8A to 8D are cross-sectional views of steps. The views illustrate an example of a method for manufacturing the semiconductor device according to this embodiment. First, the support 1 including the recess 31 and the hole 33 is prepared (FIG. 7A). A thin film is formed of the fluid resin 3A. When cured, the resin 3A becomes the chip expansion portion 3 (FIG. 7B). Then, the first semiconductor chip 10 whose circuit surface has the protrusion 32 is mounted on the support 1 with a mounter 91 (FIG. 7C). The first semiconductor chip 10 is bonded to the support 1 with the adhesive 8. Here, while an excess of the fluid resin 3A is sucked from the hole 33, the first semiconductor chip 10 is bonded (FIG. 7D). The resin is cured while the surface of the resin is planarized. As a result, the chip expansion portion 3 is formed (FIG. 7E). Here, the resin is controlled not to flow onto the top surface of the protrusion 32. Within the chip expansion portion 3, the via 7 is formed. The via 7 is connected to a terminal provided within the first semiconductor chip 10. On the protrusion 32, the terminals 11 are formed. On the surface of the chip expansion portion 3, the wire 6 is formed. The via 7 and the wire 6 are integrally formed of a single metal. Moreover, for protection of the via 7 and the wire 6 to be formed into individual pieces, the passivation film 92 is formed to cover the chip expansion portion 3 (FIG. 7F).

Figure 8A:
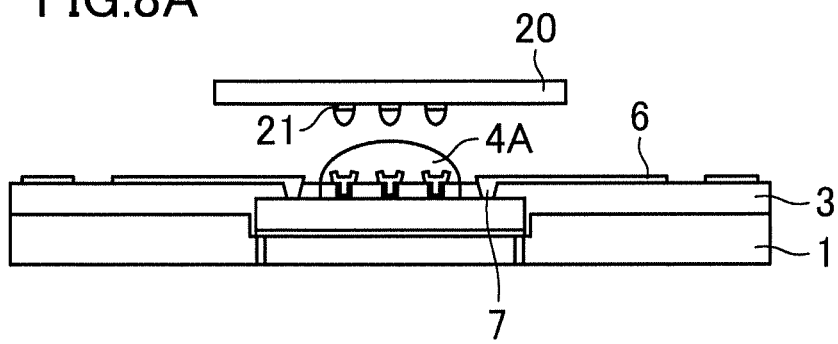
FIG. 8A is a cross-sectional view of a step, the view illustrating an example of the method for manufacturing the semiconductor device according to the third embodiment.
Figure 8B:
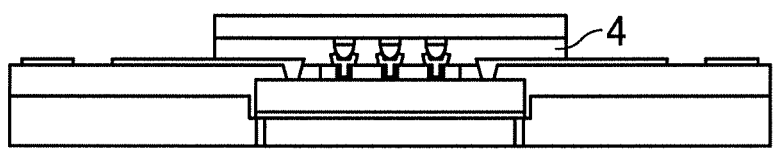
FIG. 8B is a cross-sectional view of a step, the view illustrating an example of the method for manufacturing the semiconductor device according to the third embodiment.
Figure 8C:
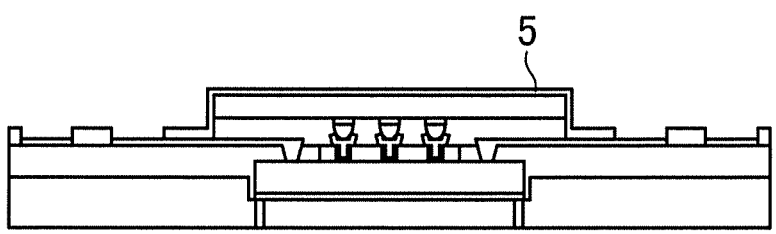
FIG. 8C is a cross-sectional view of a step, the view illustrating an example of the method for manufacturing the semiconductor device according to the third embodiment.
Figure 8D:
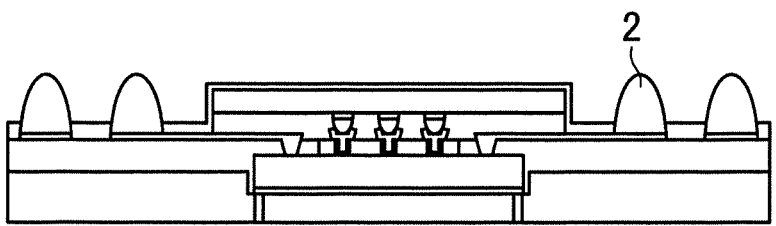
FIG. 8D is a cross-sectional view of a step, the view illustrating an example of the method for manufacturing the semiconductor device according to the third embodiment.

When the via 7 and the wire 6 become individual pieces, the passivation film 92 is removed. Then, the filler 4A is applied on the circuit surface of the first semiconductor chip 10, and the second semiconductor chip 20 is mounted above the first semiconductor chip 10 (FIG. 8A). The filler 4A is thermocompression-bonded to form the filler layer 4, and the second semiconductor chip 20 is fixed with the filler layer 4 (FIG. 8B). Then, the solder resist 5 is formed on the surface of the chip expansion portion 3, and on the rear face and the side face of the second semiconductor chip 20 (FIG. 8C). The external terminal 2 such as a soldering ball connected to the wire 6 is formed (FIG. 8D).

Figure 9A:
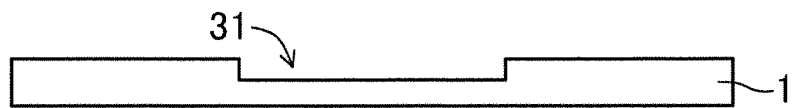
FIG. 9A is a cross-sectional view of a step, the view illustrating another example of the method for manufacturing the semiconductor device according to the third embodiment.
Figure 9B:
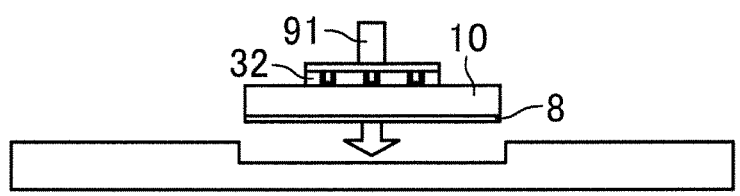
FIG. 9B is a cross-sectional view of a step, the view illustrating another example of the method for manufacturing the semiconductor device according to the third embodiment.
Figure 9C:
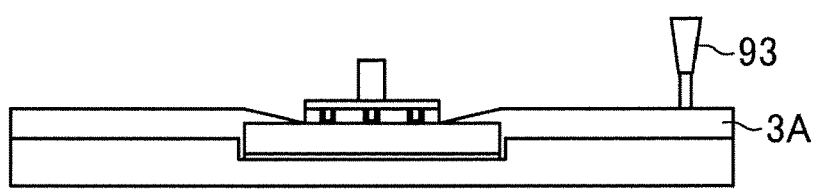
FIG. 9C is a cross-sectional view of a step, the view illustrating another example of the method for manufacturing the semiconductor device according to the third embodiment.
Figure 9D:
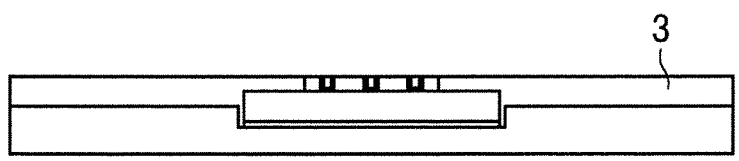
FIG. 9D is a cross-sectional view of a step, the view illustrating another example of the method for manufacturing the semiconductor device according to the third embodiment.
Figure 9E:
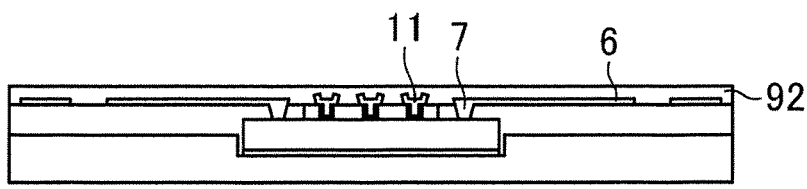
FIG. 9E is a cross-sectional view of a step, the view illustrating another example of the method for manufacturing the semiconductor device according to the third embodiment.

FIGS. 9A to 9E are cross-sectional views of steps. The views illustrate another example of the method for manufacturing the semiconductor device according to this embodiment. First, the support 1 including the recess 31 is prepared (FIG. 9A). The first semiconductor chip 10 whose circuit surface has the protrusion 32 is mounted on the support 1 with the mounter 91 (FIG. 9B). The first semiconductor chip 10 is bonded to the support 1 with the adhesive 8. Then, the fluid resin 3A is poured with a coater 93 (FIG. 9C). Here, the resin may be poured with the support 1 rotated. Then, the resin is cured while the surface of the resin is planarized. As a result, the chip expansion portion 3 is formed (FIG. 9D). Within the chip expansion portion 3, the via 7 is formed. The via 7 is connected to an output terminal of the first semiconductor chip 10. On the protrusion 32, the terminals 11 are formed. On the surface of the chip expansion portion 3, the wire 6 is formed. The via 7 and the wire 6 are integrally formed of a single metal. Moreover, for protection of the via 7 and the wire 6 to be formed into individual pieces, the passivation film 92 is formed to cover the chip expansion portion 3 (FIG. 9E). The steps following forming the via 7 and the wire 6 into individual pieces are similar to those described with reference to FIGS. 8A to 8D.

According to the configuration of this embodiment, the first semiconductor chip 10 has the protrusion 32 formed on the main surface. The first terminal group 12 is provided on the top surface of the protrusion 32. Hence, a portion, of the first semiconductor chip 10, to join to the second semiconductor chip 20 is higher than the surface of the first semiconductor chip 10. Such a feature can reduce a height of each of the terminals 21 in the second terminal group 22 of the second semiconductor chip 20, making it possible to produce the terminals 21 in a manner that a pitch between the terminals 21 is narrower than that in the first embodiment or the second embodiment. Furthermore, the feature can reduce costs of materials to form the terminals 21. Moreover, the feature can reduce the risk of faulty join caused by a time difference between thermosetting of the filler layer 4 and the join between the terminals 11 and 21.

Figure 10:
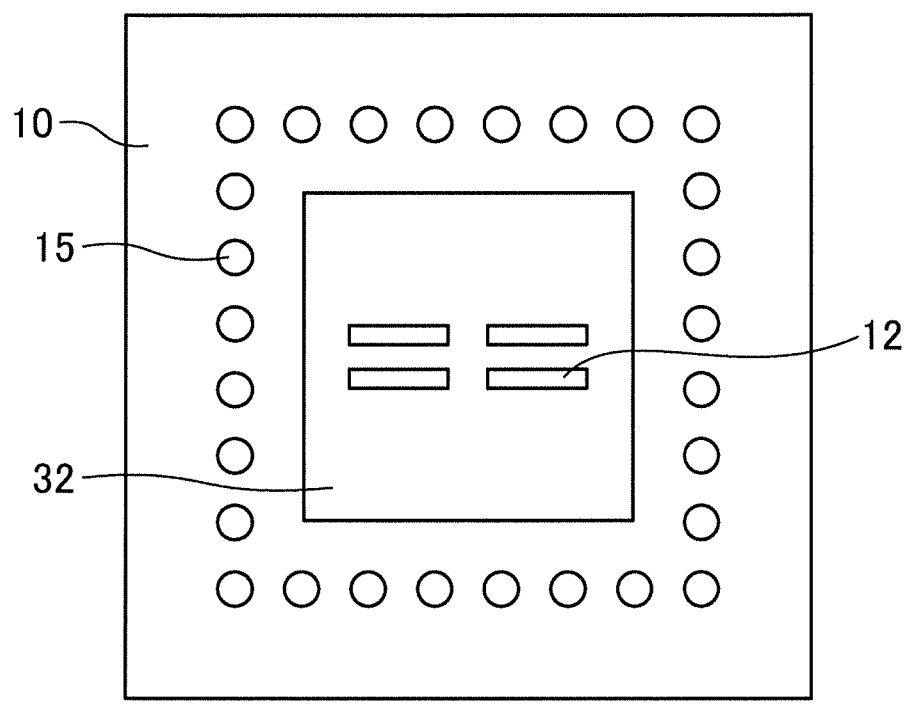
FIG. 10 is a plan view illustrating an example of a configuration of the semiconductor device according to the third embodiment.

Note that, as illustrated in FIG. 10, the top surface of the protrusion 32 may be in a square planer shape, for example. Such a feature makes it possible to reduce the risk that the resin 3A flows into the CoC joint during a step in which the first semiconductor chip 10 is embedded in the resin 3A. Furthermore, the first semiconductor chip 10 is sucked more stably toward the mounter when transported.

Fourth Embodiment

Figure 11:
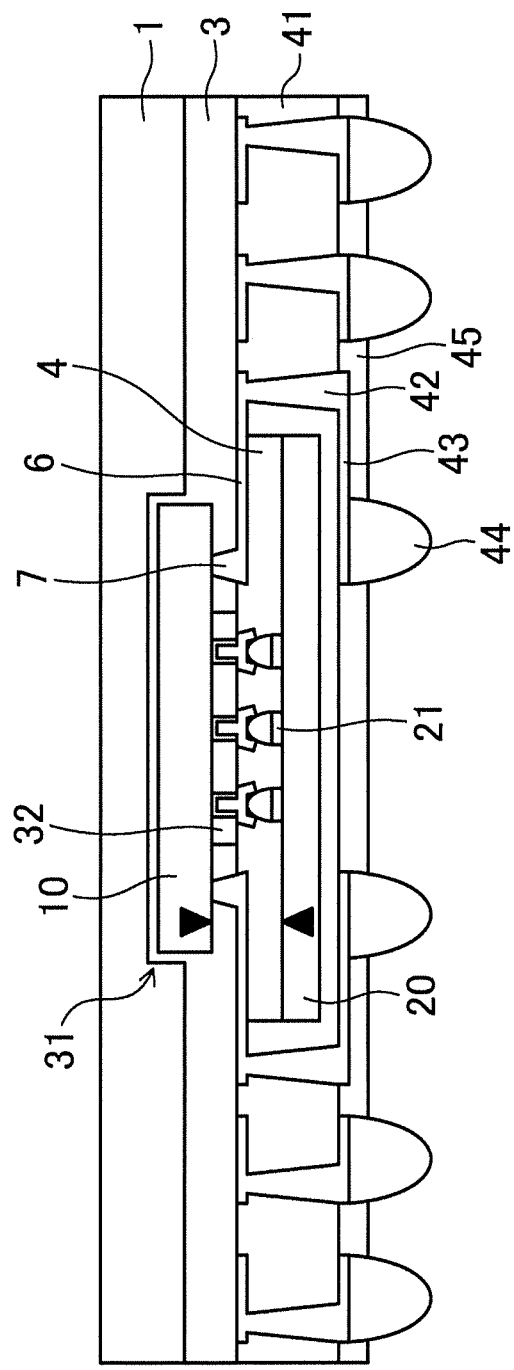
FIG. 11 is a cross-sectional view illustrating an example of a configuration of a semiconductor device according to a fourth embodiment.

FIG. 11 is a cross-sectional view illustrating an example of a configuration of a semiconductor device according to a fourth embodiment. In FIG. 11, constituent elements in common with those in FIG. 6 of the third embodiment are denoted with the same reference numerals, and detailed descriptions thereof may be omitted.

In the configuration illustrated in FIG. 11, a resin layer 41, instead of the external terminal 2, is formed above the chip expansion portion 3 to cover the second semiconductor chip 20. Then, an external terminal 44 such as a soldering ball is formed on the surface of the resin layer 41. Within the resin layer 41, a via 42 is formed. The via 42 is connected to the wire 6 formed on the surface of the chip expansion portion 3. A wire 43 is formed on the surface of the resin layer 41 to connect the via 42 to the external terminal 44.

FIGS. 12A to 12D and FIGS. 13A to 13C are cross-sectional views of steps. The views illustrate an example of a method for manufacturing the semiconductor device according to this embodiment. Note that the steps until forming the via 7 and the wire 6 into individual pieces are similar to those described with reference to FIGS. 9A to 9E in the third embodiment.

Figure 12A:
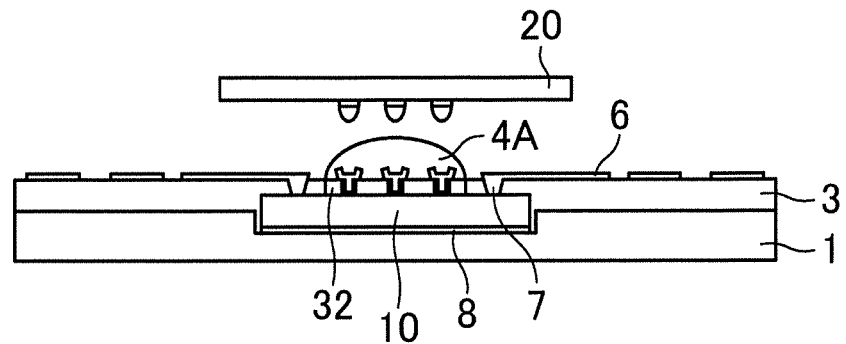
FIG. 12A is a cross-sectional view of a step, the view illustrating an example of a method for manufacturing the semiconductor device according to the fourth embodiment.
Figure 12B:
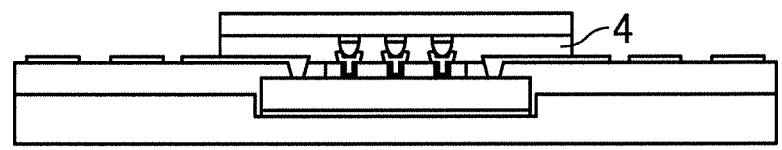
FIG. 12B is a cross-sectional view of a step, the view illustrating an example of the method for manufacturing the semiconductor device according to the fourth embodiment.
Figure 12C:
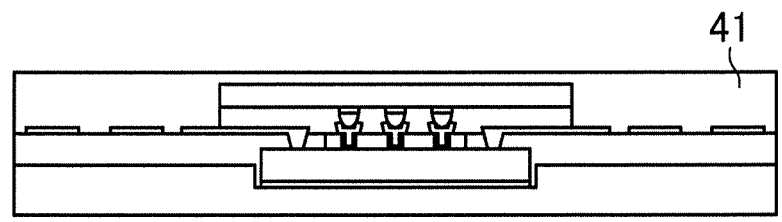
FIG. 12C is a cross-sectional view of a step, the view illustrating an example of the method for manufacturing the semiconductor device according to the fourth embodiment.
Figure 12D:
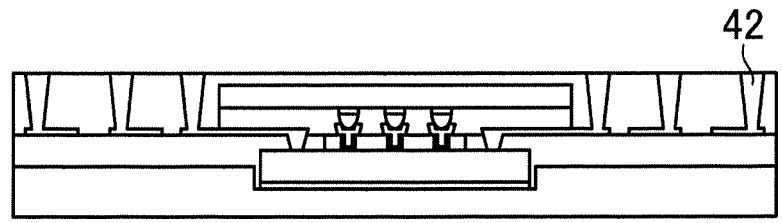
FIG. 12D is a cross-sectional view of a step, the view illustrating an example of the method for manufacturing the semiconductor device according to the fourth embodiment.

When the via 7 and the wire 6 become individual pieces, the passivation film 92 is removed. Then, the filler 4A is applied on the circuit surface of the first semiconductor chip 10, and the second semiconductor chip 20 is mounted above the first semiconductor chip 10 (FIG. 12A). The filler 4A is thermocompression-bonded to form the filler layer 4, and the second semiconductor chip 20 is fixed with the filler layer 4 (FIG. 12B). After that, the resin layer 41 is formed above the chip expansion portion 3. The resin layer 41 is cured while the surface of the resin layer 41 is planarized (FIG. 12C). Within the resin layer 41, the via 42 is formed. The via 42 is connected to the wire 6 formed on the surface of the chip expansion portion 3 (FIG. 12D).

Figure 13A:
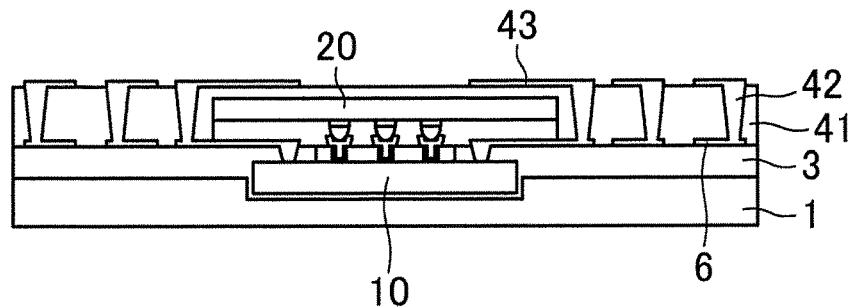
FIG. 13A is a cross-sectional view of a step, the view illustrating an example of the method for manufacturing the semiconductor device according to the fourth embodiment.
Figure 13B:
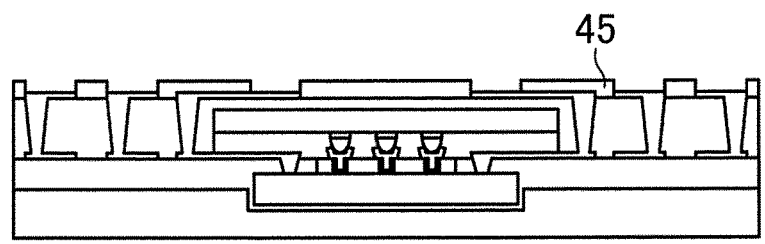
FIG. 13B is a cross-sectional view of a step, the view illustrating an example of the method for manufacturing the semiconductor device according to the fourth embodiment.
Figure 13C:
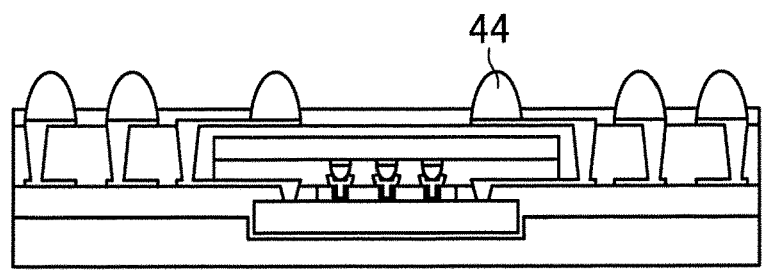
FIG. 13C is a cross-sectional view of a step, the view illustrating an example of the method for manufacturing the semiconductor device according to the fourth embodiment.

On the surface of the resin layer 41 with the via 42 formed, the wire 43 containing, for example, Cu is formed (FIG. 13A). Then, the solder resist 5 is formed on the surface of the resin layer 41 (FIG. 13B), and the external terminal 44 such as a soldering ball connected to the wire 43 is formed (FIG. 13C).

Thanks to the structure of the semiconductor device according to this embodiment, the effects described in the third embodiment can be achieved, and the external terminal 44 can be formed in an area corresponding to the rear face of the semiconductor chip 20. Hence, the number of external terminals 44 can be easily increased.

Note that the features of the semiconductor device according to this embodiment may be combined with the features of the semiconductor device according to either the first embodiment or the second embodiment.

Fifth Embodiment

In a fifth embodiment, a through electrode is included in a support on which the first semiconductor chip 10 is mounted. Examples of the support here may have a substrate structure with a through hole. Alternatively, a via may be formed in a metal and the circumference of the via may be insulated to form such a support.

Figure 14:
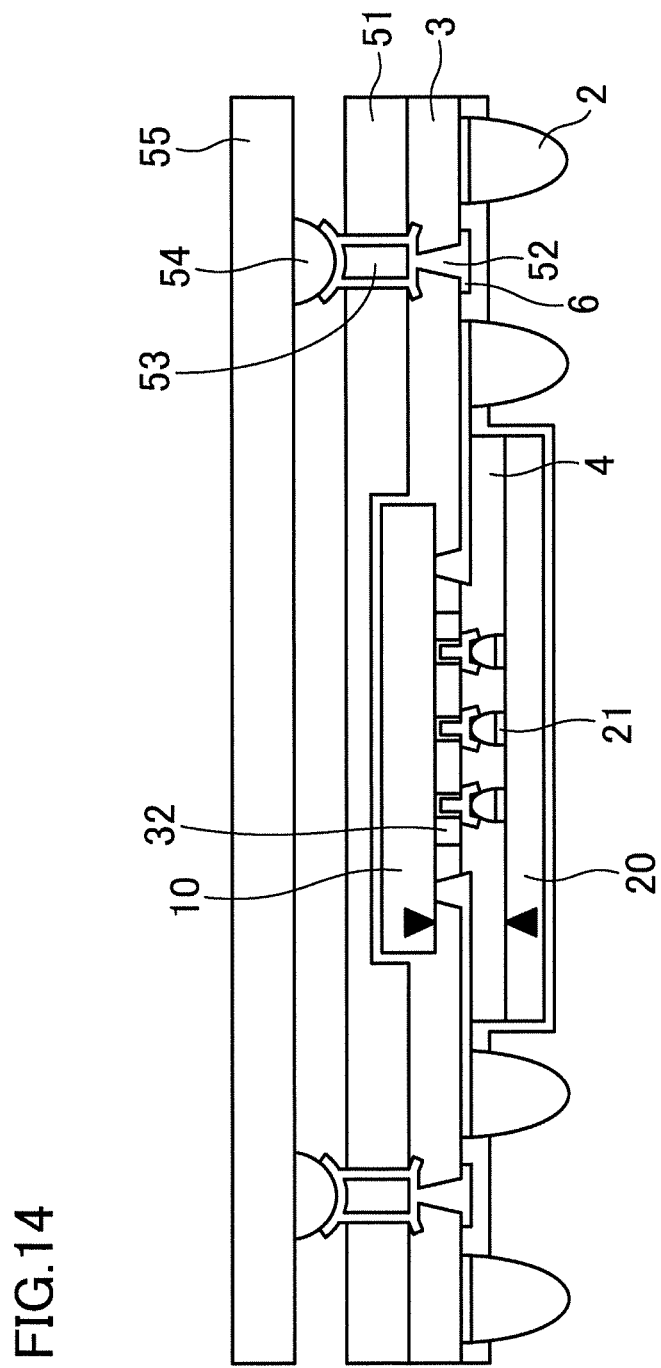
FIG. 14 is a cross-sectional view illustrating an example of a configuration of a semiconductor device according to a fifth embodiment.

FIG. 14 is a cross-sectional view illustrating an example of a configuration of a semiconductor device according to the fifth embodiment. In FIG. 14, constituent elements in common with those in FIG. 6 of the third embodiment are denoted with the same reference numerals, and detailed descriptions thereof may be omitted.

In the structure illustrated in FIG. 14, a support 51 including a through electrode 53 is used instead of the support 1. The chip expansion portion 3 has a via 52 connecting the through electrode 53 to the wire 6 formed on the surface of the chip expansion portion 3. In the configuration illustrated in FIG. 14, a package-on-package (PoP) memory 55 is mounted on a surface, of the support 51, opposite a surface on which the first semiconductor chip 10 is mounted. The PoP memory 55 includes an electrode 54 connected to the through electrode 53 of the support 51.

Figure 15A:
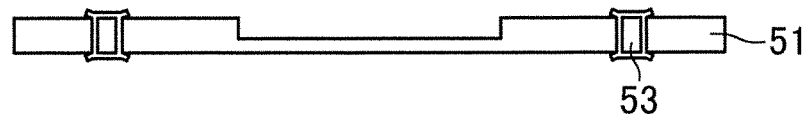
FIG. 15A is a cross-sectional view of a step, the view illustrating an example of a method for manufacturing the semiconductor device according to the fifth embodiment.
Figure 15B:
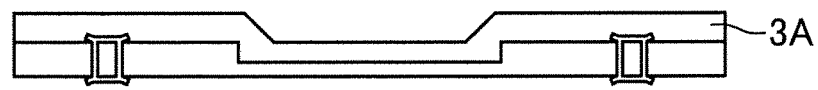
FIG. 15B is a cross-sectional view of a step, the view illustrating an example of the method for manufacturing the semiconductor device according to the fifth embodiment.
Figure 15C:
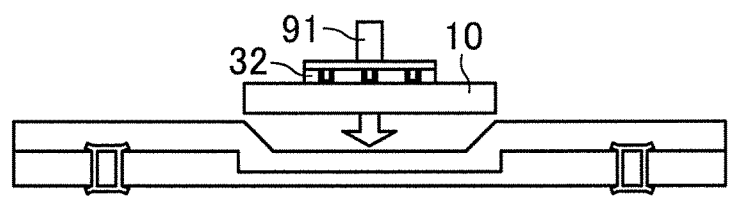
FIG. 15C is a cross-sectional view of a step, the view illustrating an example of the method for manufacturing the semiconductor device according to the fifth embodiment.
Figure 15D:
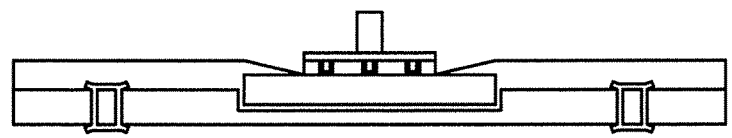
FIG. 15D is a cross-sectional view of a step, the view illustrating an example of the method for manufacturing the semiconductor device according to the fifth embodiment.
Figure 15E:
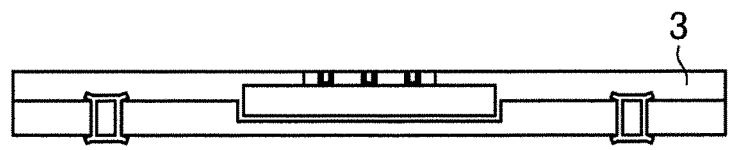
FIG. 15E is a cross-sectional view of a step, the view illustrating an example of the method for manufacturing the semiconductor device according to the fifth embodiment.
Figure 15F:
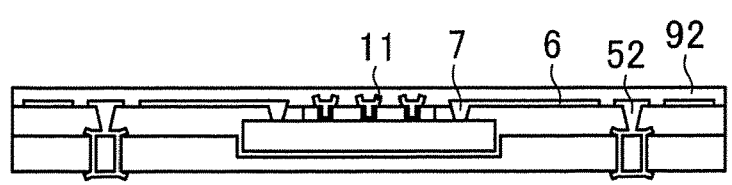
FIG. 15F is a cross-sectional view of a step, the view illustrating an example of the method for manufacturing the semiconductor device according to the fifth embodiment.

FIGS. 15A to 15F and FIGS. 16A to 16D are cross-sectional views of steps. The views illustrate an example of a method for manufacturing the semiconductor device according to this embodiment. First, the support 51 including the through electrode 53 is prepared (FIG. 15A). A thin film is formed of the resin 3A. The resin 3A becomes the chip expansion portion 3 (FIG. 15B). Then, the first semiconductor chip 10 whose circuit surface has the protrusion 32 is mounted on the support 51 with the mounter 91 (FIG. 15C). Then, the resin is poured (FIG. 15D). The resin is cured while the surface of the resin is planarized. As a result, the chip expansion portion 3 is formed (FIG. 15E). Within the chip expansion portion 3, the via 7 is formed. The via 7 is connected to a terminal provided within the first semiconductor chip 10. On the protrusion 32, the terminals 11 are formed. The via 52 is formed within the chip expansion portion 3 to correspond in position to the through electrode 53. The via 7 and the wire 6 are integrally formed of a single metal. Moreover, for protection of the via 7 and the wire 6 to be formed into individual pieces, the passivation film 92 is formed to cover the chip expansion portion 3 (FIG. 15F).

Figure 16A:
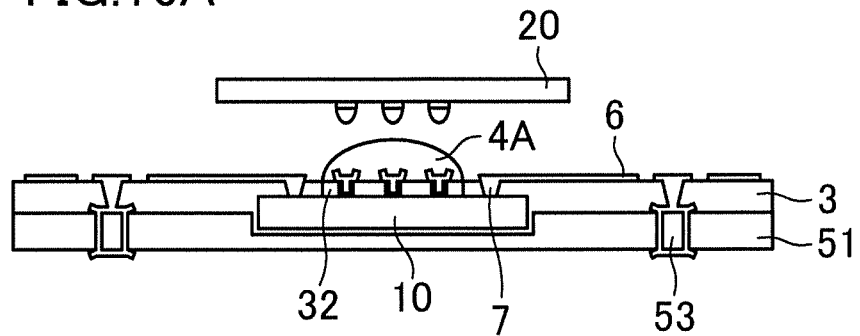
FIG. 16A is a cross-sectional view of a step, the view illustrating an example of the method for manufacturing the semiconductor device according to the fifth embodiment.
Figure 16B:
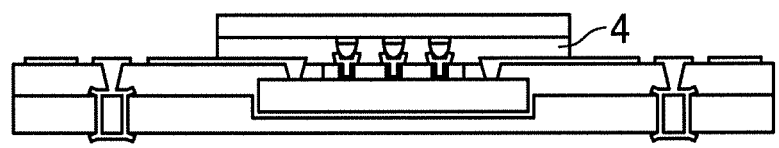
FIG. 16B is a cross-sectional view of a step, the view illustrating an example of a method for manufacturing the semiconductor device according to the fifth embodiment.
Figure 16C:
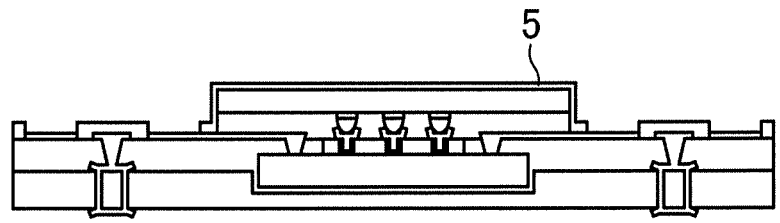
FIG. 16C is a cross-sectional view of a step, the view illustrating an example of the method for manufacturing the semiconductor device according to the fifth embodiment.
Figure 16D:
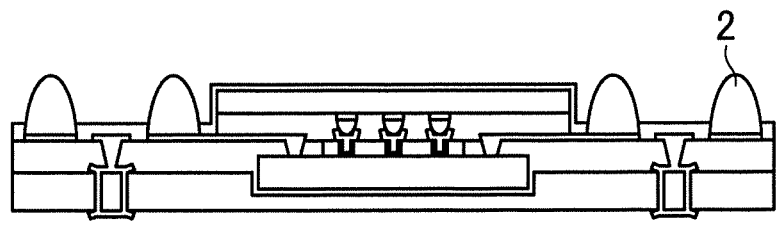
FIG. 16D is a cross-sectional view of a step, the view illustrating an example of a method for manufacturing the semiconductor device according to the fifth embodiment.

When the via 7 and the wire 6 become individual pieces, the passivation film 92 is removed. Then, the filler 4A is applied on the circuit surface of the first semiconductor chip 10, and the second semiconductor chip 20 is mounted above the first semiconductor chip 10 (FIG. 16A). The filler 4A is thermocompression-bonded to form the filler layer 4, and the second semiconductor chip 20 is fixed with the filler layer 4 (FIG. 16B). Then, the solder resist 5 is formed on the surface of the chip expansion portion 3, and on the rear face and the side face of the second semiconductor chip 20 (FIG. 16C). The external terminal 2 such as a soldering ball connected to the wire 6 is formed (FIG. 16D).

Figure 17:
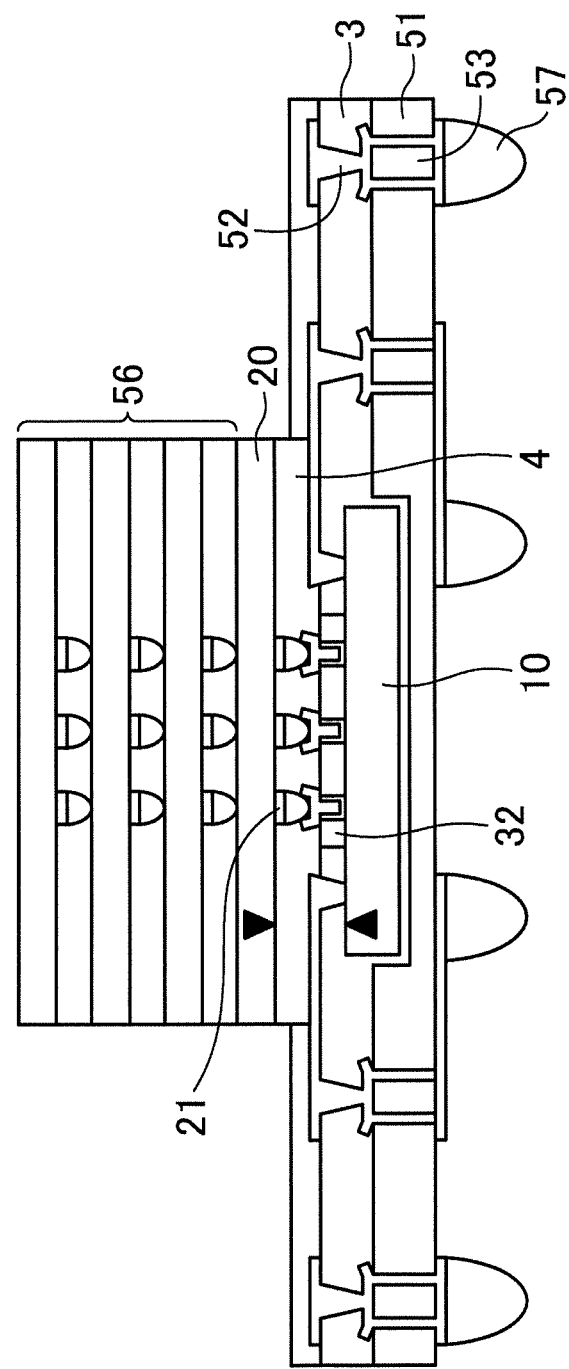
FIG. 17 is a cross-sectional view illustrating an example of another configuration of the semiconductor device according to the fifth embodiment.

FIG. 17 is a cross-sectional view illustrating an example of another configuration of the semiconductor device according to the fifth embodiment. In FIG. 17, constituent elements in common with those in FIG. 14 are denoted with the same reference numerals, and detailed descriptions thereof may be omitted. Note that the semiconductor device in FIG. 17 is illustrated upside down with respect to the semiconductor device in FIG. 14.

In the configuration illustrated in FIG. 17, an external terminal 57 such as a soldering ball is formed on a surface, of the support 51, opposite a surface on which the first semiconductor chip 10 is mounted. Meanwhile, no external terminal is formed on the surface of the chip expansion portion 3. Moreover, the second semiconductor chip 20 has another chip 56 stacked thereon to constitute, for example, a stack memory.

Figure 18:
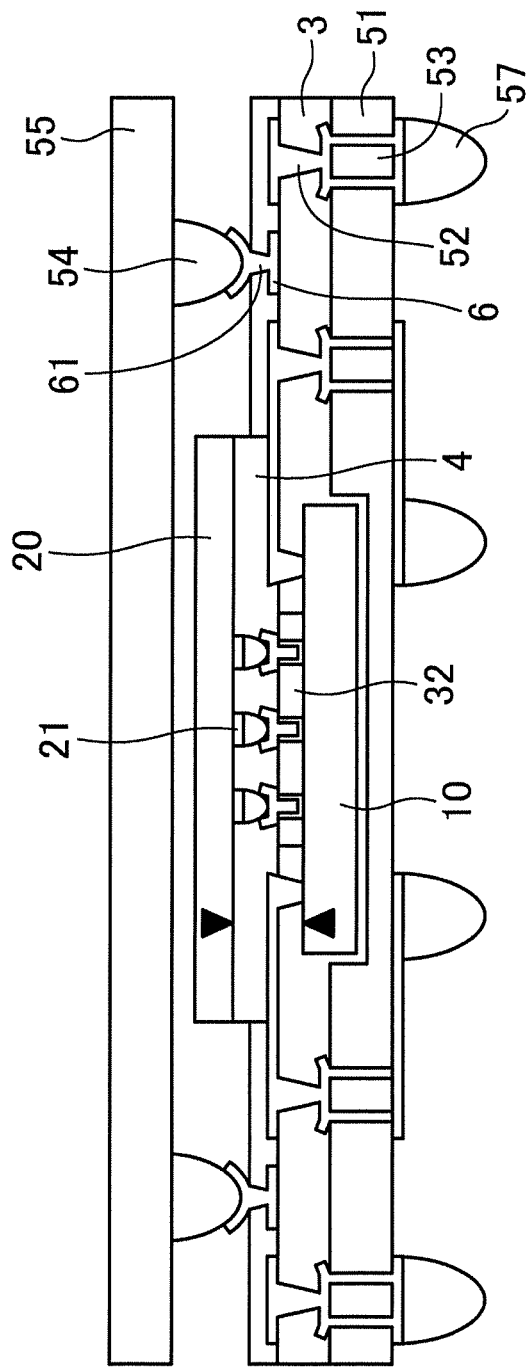
FIG. 18 is a cross-sectional view illustrating an example of another configuration of the semiconductor device according to the fifth embodiment.

FIG. 18 is a cross-sectional view illustrating an example of another configuration of the semiconductor device according to the fifth embodiment. In FIG. 18, constituent elements in common with those in FIG. 14 are denoted with the same reference numerals, and detailed descriptions thereof may be omitted. Note that the semiconductor device in FIG. 18 is illustrated upside down with respect to the semiconductor device in FIG. 14.

In the configuration illustrated in FIG. 18, the external terminal 57 such as a soldering ball is formed on a surface, of the support 51, opposite the surface on which the first semiconductor chip 10 is mounted. Meanwhile, on the surface of the chip expansion portion 3, the wire 6 and the external terminal 61 are formed. The wire 6 is connected to the via 52 connected to the through electrode 53 of the support 51. The external terminal 61 is connected to the first semiconductor chip 10. In the configuration illustrated in FIG. 18, the PoP memory 55 is mounted. The PoP memory includes the electrode 54 connected to the external terminal 61. Note that the PoP memory 55 may be a functional part such as a complementary metal-oxide semiconductor (CMOS) sensor.

Figure 19:
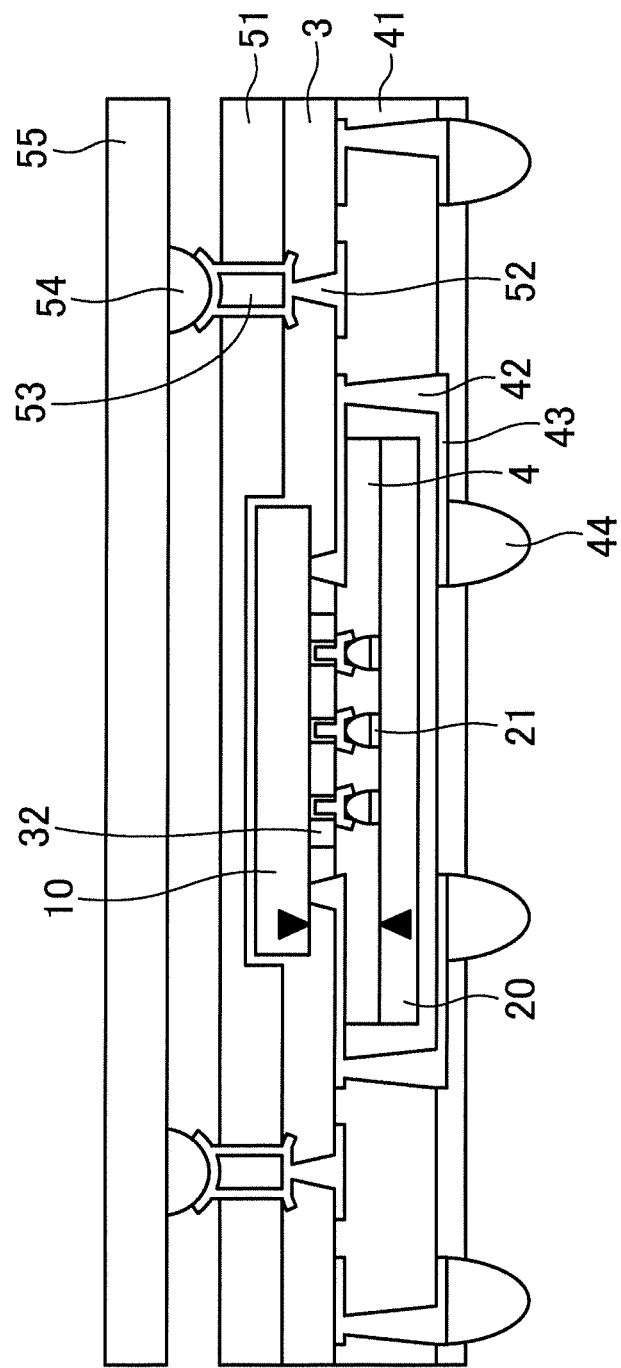
FIG. 19 is a cross-sectional view illustrating an example of another configuration of the semiconductor device according to the fifth embodiment.

FIG. 19 is a cross-sectional view illustrating an example of another configuration of the semiconductor device according to the fifth embodiment. In FIG. 19, constituent elements in common with those in FIG. 14 are denoted with the same reference numerals, and detailed descriptions thereof may be omitted.

The configuration in FIG. 19 corresponds to the configuration in FIG. 14 with the configuration in the fourth embodiment applied thereto. Specifically, the resin layer 41, instead of the external terminal 2, is formed above the chip expansion portion 3 to cover the second semiconductor chip 20. Then, an external terminal 44 such as a soldering ball is formed on the surface of the resin layer 41. Within the resin layer 41, a via 42 is formed. The via 42 is connected to the wire 6 formed on the surface of the chip expansion portion 3. A wire 43 is formed on the surface of the resin layer 41 to connect the via 42 to the external terminal 44.

According to the configuration of this embodiment, another semiconductor chip, for example, can be stacked on the opposite side of the second semiconductor chip 20. Note that the features of the semiconductor device according to this embodiment may include the features of the semiconductor device according to either the first embodiment or the second embodiment.

(Modifications)

In the above embodiments, the chip expansion portion 3 may include multiple layers. A wiring layer is provided to a surface of each of the layers. Through these wiring layers, the external terminal 2 and the first semiconductor chip 10 are connected with each other so that the connectivity can be improved.

Figure 20:
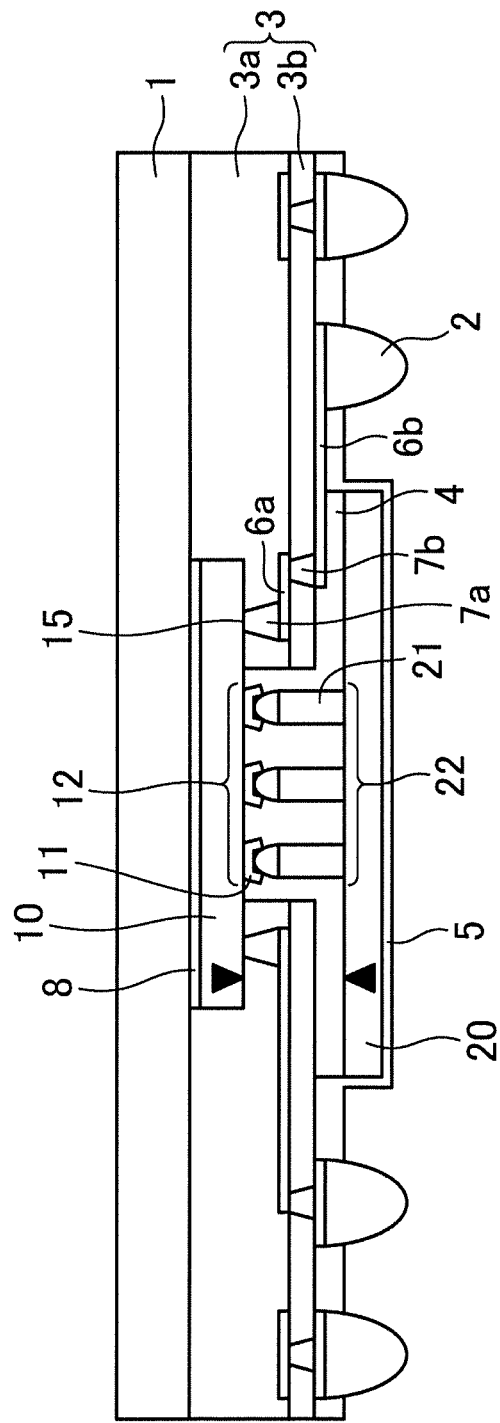
FIG. 20 is a cross-sectional view illustrating an example of a configuration of a semiconductor device according to a modification.

FIG. 20 is a cross-sectional view illustrating an example of a configuration of a semiconductor device according to these modifications. The configuration illustrated in FIG. 20 corresponds to the configuration illustrated in FIG. 1 in the first embodiment. In FIG. 20, the chip expansion portion 3 includes layers (here, two layers) 3a and 3b. The configuration other than the layers 3a and 3b is almost the same as that in FIG. 1. In FIG. 20, constituent elements in common with those in FIG. 1 are denoted with the same reference numerals, and detailed descriptions thereof may be omitted. A wiring layer is provided to a surface of each of the layers 3a and 3b. As multiple wires, a wire 6a is formed on the surface of the layer 3a, and a wire 6b is formed on the surface of the layer 3b. A via 7a acting as a second via connects the wire 6a on the bottom-most layer to the first semiconductor chip 10. A via 7b connects the wire 6a to the wire 6b. The wire 6b on the top-most layer is connected to the external terminal 2. Thanks to this configuration, the connectivity between the external terminal 2 and the first semiconductor chip 10 can be improved. The wires 6a and 6b, and the vias 7a and 7b are integrally formed as a conductor containing a single metal such as Cu.

Note that in FIG. 20, the chip expansion portion 3 includes two layers. Instead, the chip expansion portion 3 may include three layers or more. In this case, as multiple wires, a wire is formed on a surface of each of the layers. A first via is provided to connect between the wires, and a second via is provided to connect the wire on the bottom-most layer to the first semiconductor chip 10. Hence, the wire on the top-most layer is connected to the external terminal 2.

Moreover, a chip expansion portion including multiple layers may be formed by, for example, a manufacturing method described in the first embodiment. In the manufacturing method, the steps to form the chip expansion portion 3, the via 7, and the wire 6 (FIGS. 3E and 3F) may be repeated multiple times.

Here, the modifications are made to the configuration according to the first embodiment. However, the chip expansion portion 3 may include multiple layers in other embodiments as seen in FIG. 20. Thanks to this configuration, the connectivity between the external terminal 2 and the first semiconductor chip 10 can be improved. Note that when the protrusion 32 is provided to the circuit surface of the first semiconductor chip 10 as the configuration illustrated in FIG. 6 of the third embodiment, the height of the protrusion 32 may be adjusted depending on the number of layers in, and the height of, the chip expansion portion 3 to maintain the space between the second semiconductor chip 20 and the terminals 11.

The present disclosure is directed to a semiconductor device in a COC structure, and successfully makes the structure high in density, small in size, and suitable for high speed operation. The present disclosure is useful to implement, for example, a small-sized large-scale integration (LSI) for transmitting an ultrafast signal.

What is claimed is:

1. A semiconductor device comprising:
   a support;
   a first semiconductor chip having a main surface provided with a first terminal group including terminals, and a rear face mounted on a surface of the support;
   a second semiconductor chip having a main surface provided with a second terminal group including terminals, the main surface of the second semiconductor chip facing the main surface of the first semiconductor chip, and each of the terminals in the second terminal group being connected to a corresponding one of the terminals in the first terminal group of the first semiconductor chip;
   a chip expansion portion provided to surround a periphery of the first semiconductor chip, and
   an external terminal of the semiconductor device, the external terminal being provided on the chip expansion portion, wherein
   the first semiconductor chip is connected to the external terminal via a conductor containing a single metal,
   the conductor includes:
   a wire formed on a surface of the chip expansion portion, and being in direct contact with the external terminal; and
   a via formed within the chip expansion portion, and connecting the first semiconductor chip to the wire.

2. The semiconductor device of claim 1 further comprising a layer of resin covering a portion connecting the first terminal group and the second terminal group together between the first semiconductor chip and the second semiconductor chip.

3. The semiconductor device of claim 1, wherein
   the support has a recess on a first face on which the first semiconductor chip is mounted, and
   the first semiconductor chip is placed in the recess.

4. The semiconductor device of claim 3, wherein the support has a hole penetrating from a second face of the support to an interior face of the recess, the second face being opposite the first face.

5. The semiconductor device of claim 1, wherein
   the first semiconductor chip has a protrusion on the main surface, and
   the first terminal group is provided on a top surface of the protrusion.

6. The semiconductor device of claim 5, wherein the top surface of the protrusion is in a square planer shape.

7. The semiconductor device of claim 1 further comprising
   a resin layer provided to surround a periphery of the second semiconductor chip and to cover a rear face of the second semiconductor chip, wherein
   the external terminal is formed on a surface of the resin layer, corresponding to the rear face of the second semiconductor chip, and
   the conductor includes a via formed within the resin layer.

8. The semiconductor device of claim 1, wherein the support is a substrate including a through electrode.

9. The semiconductor device of claim 8, wherein
   the external terminal is formed on a rear face of the substrate, and
   the conductor includes the through electrode.

10. The semiconductor device of claim 1, wherein the external terminal connects the semiconductor device to an external device.

* * * * *